US006986092B2

(12) United States Patent
Butler et al.

(10) Patent No.: US 6,986,092 B2
(45) Date of Patent: Jan. 10, 2006

(54) ERASURE-AND-SINGLE-ERROR CORRECTION DECODER FOR LINEAR BLOCK CODES

(75) Inventors: Brian K. Butler, La Jolla, CA (US); Jack K. Wolf, La Jolla, CA (US); Ryan Milne, San Diego, CA (US)

(73) Assignee: Qualcomm Inc., San Diego, CA (US)

( * ) Notice: Subject to any disclaimer, the term of this patent is extended or adjusted under 35 U.S.C. 154(b) by 702 days.

(21) Appl. No.: 10/010,199

(22) Filed: Dec. 4, 2001

(65) Prior Publication Data

US 2003/0106008 A1 Jun. 5, 2003

(51) Int. Cl.
H03M 13/00 (2006.01)
(52) U.S. Cl. .................. 714/752; 714/746; 714/799
(58) Field of Classification Search ............... 714/752, 714/746, 799, 786; 370/333; 375/348, 267, 375/229; 386/68
See application file for complete search history.

(56) References Cited

U.S. PATENT DOCUMENTS

| 5,446,759 A | * | 8/1995 | Campana, Jr. ............. 375/267 |
| 5,636,253 A | * | 6/1997 | Spruyt ....................... 375/348 |
| 2002/0075830 A1 | * | 6/2002 | Hartman ................... 370/333 |
| 2002/0106190 A1 | * | 8/2002 | Nygren et al. ............. 386/68 |

FOREIGN PATENT DOCUMENTS

EP 0407101 A2 1/1991

OTHER PUBLICATIONS

Rizzo, Luigi., *On the feasibility of software FEC*; Dip. di Ingegneria dell'Informazione, Universita di Pisa, via Diotisalvi 2—56126 Pisa (Italy).

Katayama, Y et al: "One-Shot Reed-Solomon Decoding For High-Performance Dependable Systems", 2000 IEEE International Networks, NY, USA, Jun. 25, 2000, pp. 390-399.

Alzahrani, F et al: "On-Chip TEC-QED ECC For Ultra-Large, Single-Chip Memory Systems", Proceedings IEEE International Conference On Computer Design, Oct. 10, 1994, pp. 132-137.

Franklin, M et al: "Theory and Techniques For Testing Check Bits Of Rams With On-Chip ECC", IEICE Transactions On Information and Systems, Tokyo, Japan, vol. E76-D, No. 10, Oct. 1, 1993, pp. 1243-1252.

Nagvajara, P: Multichip Module Diagnosis, Electro/94 International Conference Proceedings, Boston, MA, IEEE, USA. Combined Volumes, May 10, 1994, pp. 793-802.

* cited by examiner

*Primary Examiner*—Albert Decady
*Assistant Examiner*—Dipakkumar Gandhi
(74) *Attorney, Agent, or Firm*—Philip R. Wadsworth; Charles D. Brown; Kenyon S. Jenckes (57) ABSTRACT

Techniques for efficiently performing erasure-and-single-error correction block decoding on a received block of symbols previously coded column-wise with an (N, K) linear block code and row-wise with an error detection code (e.g., a CRC code). Initially, each row of the received block is marked as either an erased row or an un-erased row. To perform erasure-and-single-error correction block decoding on the received block, a codeword corresponding to a column of the received block containing an undetected symbol error is initially identified. The location of the symbol error in the codeword is then determined based on a particular block decoding scheme and corresponding to the selected (N, K) block code. The row of the received block containing the symbol error is then marked as an erased row. Block decoding may then be performed for the received block with the newly marked erased row containing the symbol error.

32 Claims, 7 Drawing Sheets

FIG. 1

Transmitter

Step 1: Encode an information block, $i_{KxL}$, by pre-multiplying it with a generator matrix, $G_{NxK}$, to derive a coded block, $c_{NxL}$.

Receiver

Step 2: Receive the coded block. Determine erased rows in the received block, $r_{NxL}$, and mark the corresponding rows of the generator matrix as erased.

Step 3: Form a reduced received block, $r'_{KxL}$, with any K un-erased rows of $r_{NxL}$, and form a reduced generator matrix, $G'_{KxK}$, with K corresponding rows of $G_{NxK}$.

Step 4: Invert $G'_{KxK}$. Derive an initial estimate of the information block, $i'_{KxL}$, by multiplying $G'^{-1}_{KxK}$ with $r'_{KxL}$.

Step 5: Form an estimated information block, $\hat{i}_{KxL}$, by replacing the erased systematic rows of the received block, $r_{NxL}$, with the corresponding rows of $i'_{KxL}$.

FIG. 2

Receiver

Step 3: Select an un-erased systematic row in the received block to be a pseudo-erasure row. Mark the corresponding row in the generator matrix as erased.

Step 4: Form a reduced received block, $r'_{KxL}$, with any K un-erased rows of $r_{NxL}$, and form a reduced generator matrix, $G'_{KxK}$, with K corresponding rows of $G_{NxK}$.

Step 5: Invert $G'_{KxK}$. Derive an initial estimate of the information block, $i'_{KxL}$, by multiplying $G'^{-1}_{KxK}$ with $r'_{KxL}$.

Step 6: Compare the pseudo-erasure row against the corresponding row of $i'_{KxL}$ and identify the location of an unmatched symbol. Perform error location on a codeword corresponding to a column containing the unmatched symbol.

FIG. 3A

Step 7: Mark the row with the symbol error as an erased row. Mark the pseudo-erasure row as un-erased. Form a new reduced received block, $r''_{KxL}$, with any K un-erased rows of $r_{NxL}$, and form a new reduced generator matrix, $G''_{KxK}$, with K corresponding rows of $G_{NxK}$.

Step 8: Repeat Step 5. Invert $G''_{KxK}$. Derive a new initial estimate of the information block, $i''_{KxL}$, by multiplying $G''^{-1}_{KxK}$ with $r''_{KxL}$.

Step 9: Form an estimated information block, $\hat{i}_{KxL}$, by replacing the erased systematic rows of the received block, $r_{NxL}$, with the corresponding rows of $i''_{KxL}$.

ERASURE-AND-SINGLE-ERROR CORRECTION DECODER FOR LINEAR BLOCK CODES

BACKGROUND

1. Field

The present invention relates generally to data communication, and more specifically to techniques to efficiently perform erasure-and-single-error correction decoding for linear block codes.

2. Background

With the advent of digital communication and the need to transmit large amounts of data through an impaired and band-limited channel, the need for coding of data to facilitate correct reception is of great importance. A data transmission is typically degraded by impairments in a communication channel, such as thermal noise, interference, spurious signals with the transmission bandwidth, and so on. The received data is thus typically a distorted version of the transmitted data.

Coding may be used to allow a receiver to detect and/or correct for errors in the received data. Various error-correction codes are available and may be categorized into several classes such as block codes and convolutional codes. Convolutional codes provide good error-correction capability but typically output correlated bursts of errors. Block codes have built-in burst error handling capability when combined with a proper level of interleaving. For example, a Reed-Solomon code can handle any burst of errors within a symbol, which may be defined as comprising a particular number of bits.

In theory, a block code is able to correct for a particular number of erasures and/or a particular number of errors, with the exact number for each being determined by the distance of the code. An erasure may be indicated for a symbol that is known a priori to be potentially bad, and an error is a symbol that is received in error but is not known as such a priori. Erasures are typically known or may be determined by the receiver, and may be accounted for accordingly in the decoding process. Errors are undetected symbol errors, which may be symbols that are erroneously detected as having been received correctly when in fact they were not.

Conventional erasure-and-error correction block decoders (such as the Berlekamp-Massey or Euclidean decoder) are complex and typically require implementation in dedicated hardware. These block decoders are typically too computationally intensive for software-based implementation executed on a microprocessor. Hardware based decoders can exploit parallelism in the decoding algorithms and use a pipelined datapath, both of which are not possible on a traditional microprocessor. More efficient block decoder algorithms are available that may be more suitable for software-based implementation. However, these decoder algorithms typically have limited capabilities and may be able to correct for erasures but not errors.

There is therefore a need in the art for an efficient erasure-and-error correction decoder for linear block codes, and which may be suitable for software-based implementation.

SUMMARY

Aspects of the invention provide techniques for efficiently performing erasure-and-single-error correction block decoding on a received block of symbols previously coded column-wise with an (N, K) linear block code and row-wise with an error detection code. If the error detection code (e.g., a CRC code) on the rows has relatively good error detection properties, then the probability of more than one undetected error row in a received data block is very low. Thus, single error correction is typically sufficient in most applications.

Initially, each row of the received block is marked as either an erased row or an un-erased row until at least (K+1) un-erased rows are found. Typically all N rows of the received block are marked, but this is not absolutely necessary. The rows may be marked based on cyclic redundancy check (CRC) bits included in each row, or by some other means. Erasure-only or erasure-and-error correction block decoding may then be performed on the received block depending on the number of erased rows, i.e., as supported by the distance of the (N, K) block code.

To perform erasure-and-single-error correction block decoding on the received block, a codeword corresponding to a column of the received block containing an undetected symbol error is initially identified. The undetected symbol error may be one that is not detected by the CRC check previously performed on each row of the received block. This codeword may be identified by (1) deriving an estimate of an un-erased systematic row of the received block, (2) comparing the un-erased systematic row against its estimate, and (3) identifying an unmatched symbol between the un-erased systematic row and its estimate. The codeword then corresponds to the column containing the unmatched symbol.

The location of the (previously undetected) symbol error in the codeword is then determined based on a particular block decoding scheme (e.g., one known in the art and corresponding to the selected linear block code). The row of the received block containing the located symbol error is then marked as an erased row. Block decoding may then be performed in the normal manner for the received block with the marked erased row containing the symbol error. In this way, an erasure-only correction block decoding technique may be used to achieve erasure-and-single-error correction block decoding on the received block. The erasure-and-single-error correction block decoding technique described herein is computationally efficient (relative to conventional techniques) and may be implemented in hardware, software, or a combination thereof.

Various aspects and embodiments of the invention are described in further detail below. The invention further provides methods, computer program products, decoders, receiver units, and other apparatuses and elements that implement various aspects, embodiments, and features of the invention, as described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

The inventive block decoding techniques described herein may be used for various coding schemes. For clarity, these techniques are described for a specific two-dimensional product-coding scheme comprised of a cyclic redundancy check (CRC) row code and a linear block column code. An example communication system wherein the inventive block decoding techniques may be used is described below.

Figure 1:
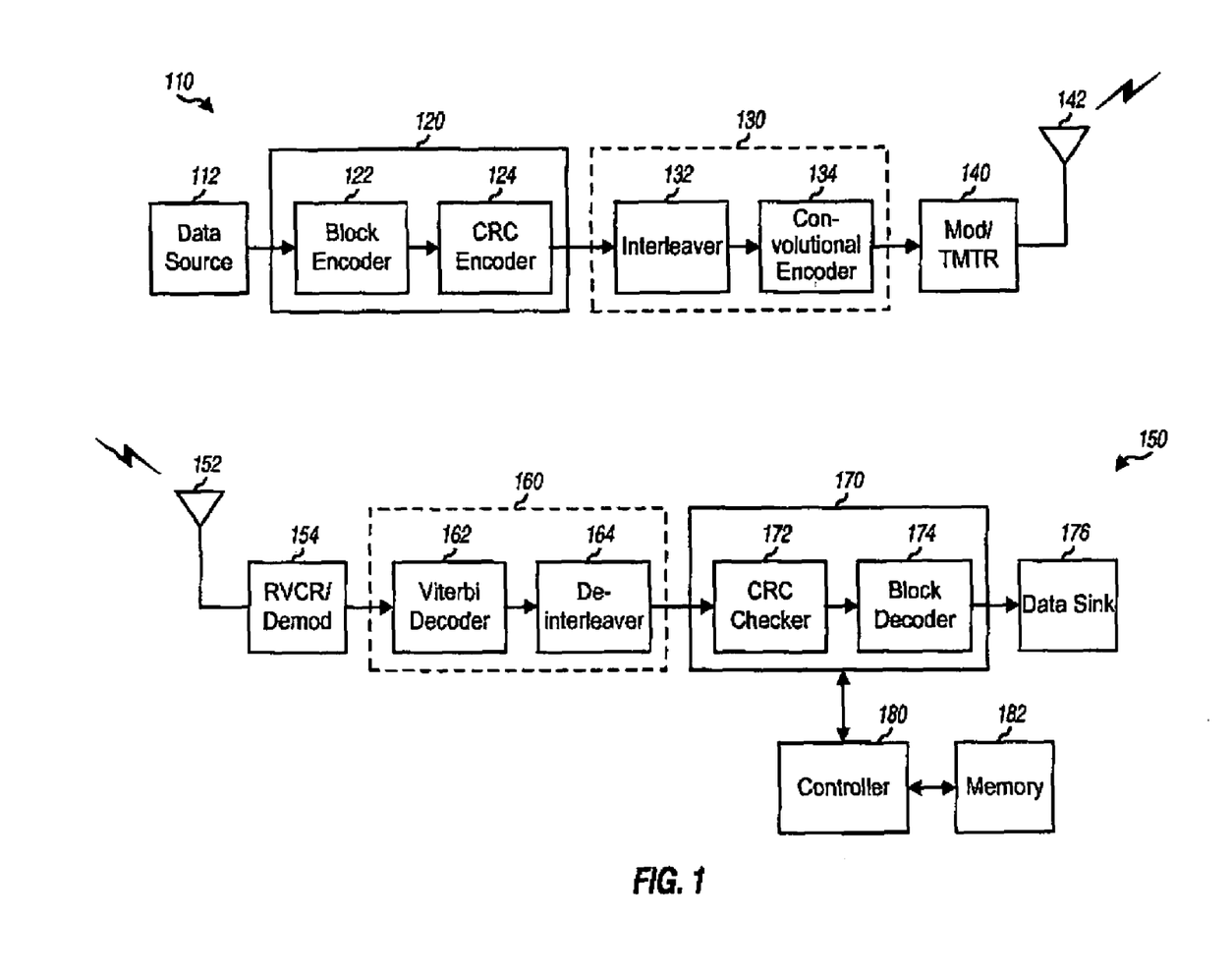
FIG. 1 is a block diagram of a transmitter unit and a receiver unit capable of implementing various aspects and embodiments of the invention.

FIG. 1 is a block diagram of a transmitter unit 110 and a receiver unit 150 capable of implementing various aspects and embodiments of the invention. At transmitter unit 110, a data source 112 provides data (e.g., in frames of a particular length) to an outer encoder 120 that includes a block encoder 122 and a CRC encoder 124. Block encoder 122 receives and codes each block of a particular number of data frames to provide a corresponding block-coded data block. In an embodiment, the bits in a data block are first grouped to form symbols (with each symbol comprising $N_B$ bits), and each column of K symbols in the data block is coded with a particular (N, K) linear block code to provide a corresponding codeword of N symbols. A block-coded data block thus comprises N rows of symbols. For a systematic block code, the first K rows are the data rows and the remaining (N−K) rows are the parity rows.

For each of the N frames in the block-coded data block, CRC encoder 124 generates a set of CRC bits based on the data bits in the frame and appends the CRC bits to the end of the frame. The CRC bits included in each frame are used for error detection of the frame at the receiver unit. CRC encoder 124 provides coded blocks, each of which is CRC-coded in one (horizontal) direction and block-coded in the other (vertical) direction.

Block encoder 122 may implement any linear block code such as a Reed-Solomon code (which is commonly used for data transmission), a Hamming code, a BCH (Bose, Chaudhuri, and Hocquenghem) code, or some other code. The inventive block decoding techniques described herein may be used for any linear block code and may advantageously be used for systematic block codes.

In the embodiment shown in FIG. 1, the coded blocks are provided to an inner encoder 130 that includes an interleaver 132 and a convolutional encoder 134. Interleaver 132 shuffles (i.e., reorders) the bits in each coded block and provides interleaved bits to convolutional encoder 134, which then codes the bits in accordance with a particular convolutional code. The interleaving provides time diversity and disperses errors that may occur in bursts from a convolutional decoder.

Although inner encoder 130 may be used to provide additional error correction capability, the inventive block decoding techniques described herein may be used for a coding scheme that does not include the inner coding provided by encoder 130. Inner encoder 130 is thus optional, as represented by the dashed box. Also, the data provided to outer encoder 120 may represent data that has been previously coded with a particular code (i.e., instead of "raw" data or information bits).

The coded data from inner encoder 130 is then provided to a modulator/transmitter (Mod/TMTR) 140, which modulates (e.g., covers and spreads) the coded data to provide modulated data and further conditions (e.g., converts to one or more analog signals, filters, amplifies, upconverts, and quadrature modulates) the modulated data to provide a modulated signal suitable for transmission over a (e.g., wireless) communication channel.

At receiver unit 150, the transmitted modulated signal is received by an antenna 152 and provided to a receiver/demodulator (RCVR/Demod) 154. Receiver/demodulator 154 conditions (e.g., filters, amplifies, and downconverts) the received signal and digitizes the conditioned signal to provide data samples. Receiver/demodulator 154 may further process (e.g., despread and decover) the data samples to provide demodulated data.

In the embodiment shown in FIG. 1, the demodulated data is provided to an inner decoder 160 that includes a Viterbi decoder 162 and a de-interleaver 164. Viterbi decoder 162 performs decoding for the convolutional code used at transmitter unit 110, and de-interleaver 164 reorders the decoded bits in a complementary manner to that performed by interleaver 132. The deinterleaved data is then provided to an outer decoder 170.

Outer decoder 170 includes a CRC checker 172 and a block decoder 174. For each received block corresponding to a coded block transmitted from the transmitter unit, CRC checker 172 checks each row of the received block and provides an indication of whether the row was received correctly or in error (i.e., erased). The CRC-checked block is then provided to block decoder 174, which performs erasure-and-single-error or erasure-only correction block decoding on the block, as described in further detail below. The decoded data from block decoder 174 is then provided to a data sink 176.

A controller 180 may be used to direct various decoding steps at receiver unit 150. Controller 180 may also be used to implement some or all of outer decoder 170. In this case, the program codes and necessary data may be stored in a memory 182, which is operatively coupled to controller 180.

FIG. 1 shows a specific embodiment of the transmitter and receiver units capable of implementing various aspects and embodiments of the invention. Other transmitter and receiver designs may also be used and are within the scope of the invention. For example, a receiver unit may be designed to include CRC checker 172 and block decoder 174 but no inner decoder 160.

Figure 2:
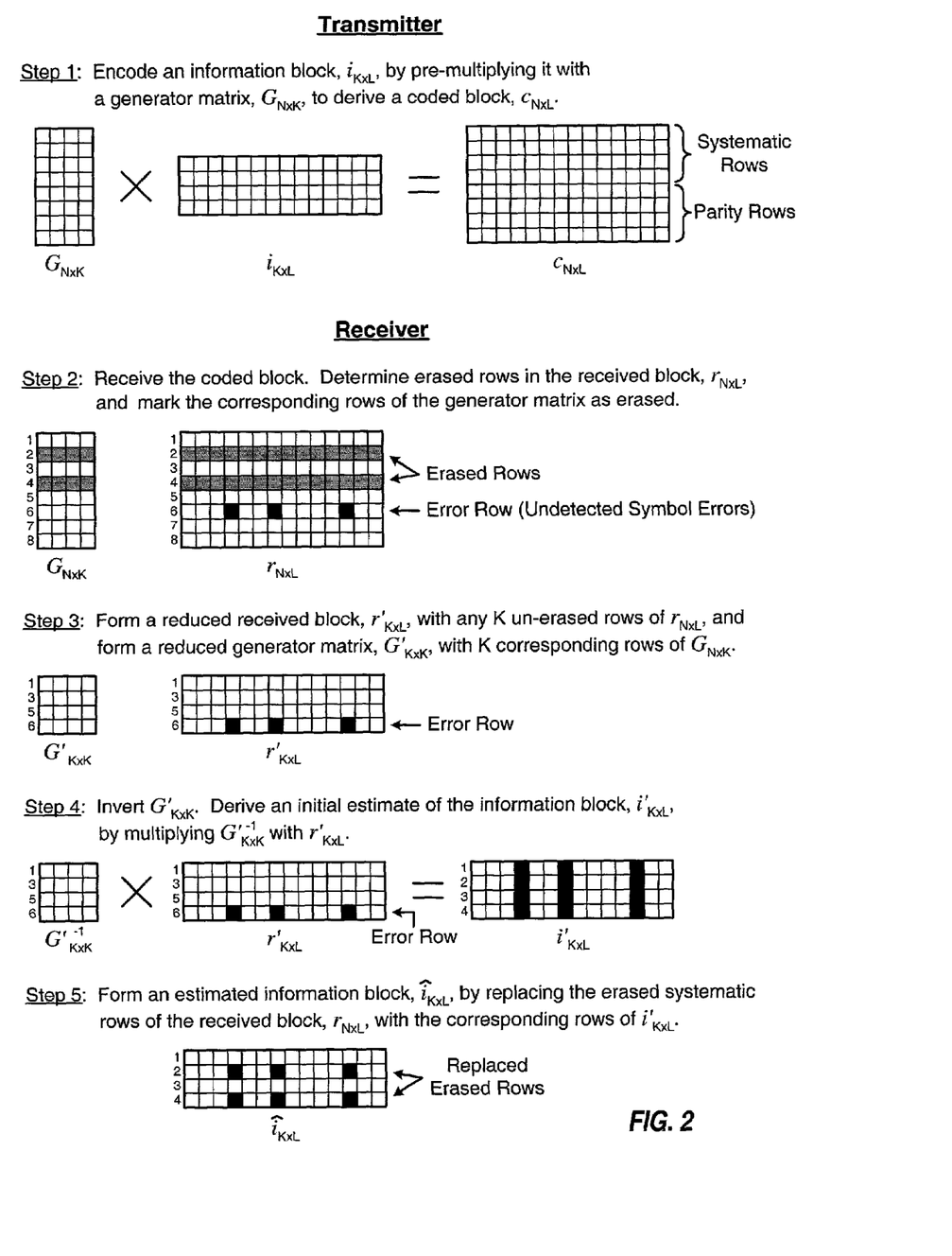
FIG. 2 is a diagram that graphically illustrates the various steps for performing erasure-only correction block decoding for a linear block code.

FIG. 2 is a diagram that graphically illustrates the various steps for performing erasure-only correction block decoding for a linear block code. An (N, K) linear block encoder codes each "block" of K data symbols (in accordance with a particular set of polynomials if it is a cyclic code) to provide a corresponding codeword of N code symbols. The minimum distance, D, of the code determines the erasure and error correction capability of the block code and the code parameters (N, K) determine the memory requirement. It is known that an (N, K) block code can simultaneously correct for T symbol errors and F erasures in a given codeword, where T and F conform to the following condition:

$$(2T+F) \leq (D-1). \qquad \text{Eq(1)}$$

The inventive block decoding techniques described herein may be used for any code rate. For simplicity, a small code with rate (8, 4) and minimum distance D=5 is used for the specific example shown in FIG. 2.

At the transmitter unit, each group of some particular number of data frames is represented by a K×L information block, $i_{K \times L}$. In an embodiment, each row of the information block corresponds to a respective data frame and includes L symbols for all the bits in that frame. Each symbol (which is represented with a small square box in the information block, $i_{K \times L}$) comprises $N_B$ bits, with the specific value for $N_B$ being dependent on the particular block code selected for use.

The block encoding is performed by pre-multiplying the information block, $i_{K \times L}$, with an N×K generator matrix, $G_{N \times K}$ (step 1). The generator matrix may be derived based on the set of polynomials determined for the selected linear block code. Techniques for determining the polynomials and deriving the generator matrix are known in the art and not described herein. Since each symbol in the information block and the generator matrix may be a multi-bit value, the element-by-element multiplications and additions for the matrix multiplication are performed over the Galois field $GF(2^{N_B})$, where $N_B$ is the number of bits for each symbol. The multiplication of the generator matrix with the information block produces an N×L coded block, $C_{N \times L}$.

For a systematic (N, K) block code, each codeword includes K data symbols and (N−K) parity symbols that are formed by linear combinations of the K data symbols. Thus, for the example shown in FIG. 2, the coded block, $C_{N \times L}$, includes K systematic rows for the K data rows in the information block, $i_{K \times L}$, and (N−K) parity rows generated based on the K data rows and the generator matrix. Each of the L columns in the coded block, $C_{N \times L}$, corresponds to a respective codeword.

As shown in FIG. 1, the coded block, $C_{N \times L}$, is further processed at the transmitter unit and transmitted to the receiver unit, which then performs the complementary processing to provide a received block, $r_{N \times L}$. Each symbol in the received block, $r_{N \times L}$, corresponds to a symbol in the coded block, $C_{N \times L}$, but may be received in error due to degradation caused by the communication channel.

At the receiver unit, each row (e.g., each data frame) in the received block may be checked by CRC checker 172 to determine whether or not the row has been received correctly or in error (step 2). If the CRC for a particular row does not check, then that entire row is deemed to have been received incorrectly, even though the error may be to only one symbol in the row, some of the symbols, or all of the symbols. For the example shown in FIG. 2, rows 2 and 4 of the received block, $r_{N \times L}$, are marked as erased since the CRC did not check for these rows. These erased rows are indicated by the rows of shaded square boxes.

In certain instances, a row may pass the CRC check even though it includes multiple errors. This may occur if the number of errors in the row exceeds the error detection capability of the selected CRC code and the specific values for the errors are such that the CRC (coincidentally) checks. In such a case, the row would be (erroneously) indicated as having been received correctly when in fact it includes multiple undetected symbol errors. An example of such an error row is shown by row 6 in the received block, $r_{N \times L}$, where the three undetected symbol errors are indicated by the three black square boxes.

A block decoding technique that only corrects for erasures (but not errors) may be performed as follows. First, the rows of the generator matrix, $G_{N \times K}$ corresponding to the erased rows of the received block, $r_{N \times L}$, are also marked as erased (step 2). For the example shown in FIG. 2, rows 2 and 4 of the generator matrix, $G_{N \times K}$, are marked as erased, as indicated by the shaded square boxes in $G_{N \times K}$.

For the next step in the erasure-only correction block decoding, any K un-erased rows of the received block, $r_{N \times L}$, are selected to form a reduced received block, $r'_{K \times L}$, and the corresponding K rows of the generator matrix, $G_{N \times K}$, are also selected to form a reduced generator matrix, $G'_{K \times K}$ (step 3). For the example shown in FIG. 2, the first four un-erased rows (i.e., rows 1, 3, 5, and 6) of the received block, $r_{N \times L}$, are selected to form the reduced received block, $r'_{K \times L}$, and the corresponding rows 1, 3, 5, and 6 of the generator matrix, $G_{N \times K}$, are selected to form the reduced generator matrix, $G'_{K \times K}$. In this example, one of the selected rows (i.e., row 6) also happens to include undetected symbol errors.

The reduced generator matrix, $G'_{K \times K}$, is then inverted to derive an inverted (or inverse) generator matrix, $G'_{K \times K}{}^{-1}$ (step 4). The matrix inversion may be performed in a manner known in the art. The inverted generator matrix, $G'_{K \times K}{}^{-1}$, is then multiplied with the reduced received block, $r'_{K \times L}$, to derive an initial estimate of the information block, $i'_{K \times L}$ (step 4). An estimate of the information block, $\hat{i}_{K \times L}$, may then be derived by replacing the erased systematic rows (i.e., rows 2 and 4) of the received block, $r_{N \times L}$, with the corresponding rows of the initial estimated information block, $i'_{K \times L}$ (step 5).

If the symbols in all of the rows in the reduced received block, $r'_{K \times L}$, are of correct values, then the estimated information block, $\hat{i}_{K \times L}$, would be equal to the transmitted information block, $i_{K \times L}$ (i.e., $\hat{i}_{K \times L} = i_{K \times L}$) In this way, the block decoding is able to correct for erasures in the received block, $r_{N \times L}$, by using the redundant parity rows (i.e., rows 5 and 6) to recover the erased systematic rows (i.e., rows 2 and 4).

However, for the example shown in FIG. 2, the undetected symbol errors in the last row of the reduced received block, $r'_{K \times L}$, result in errors in the corresponding columns of the initial estimated information block, $i'_{K \times L}$. These errors are shown by the black square boxes in columns 4, 7, and 12 of the initial estimated information block, $i'_{K \times L}$. Since rows 2 and 4 of the received block, $r_{N \times L}$, are erased, these rows are replaced by the corresponding rows 2 and 4 of the initial estimated information block, $i'_{K \times L}$. As shown in FIG. 2, each of the replaced erased rows will include as many symbol errors as those in the error row. These errors would then be presented to the next processing stage.

Figure 3A:
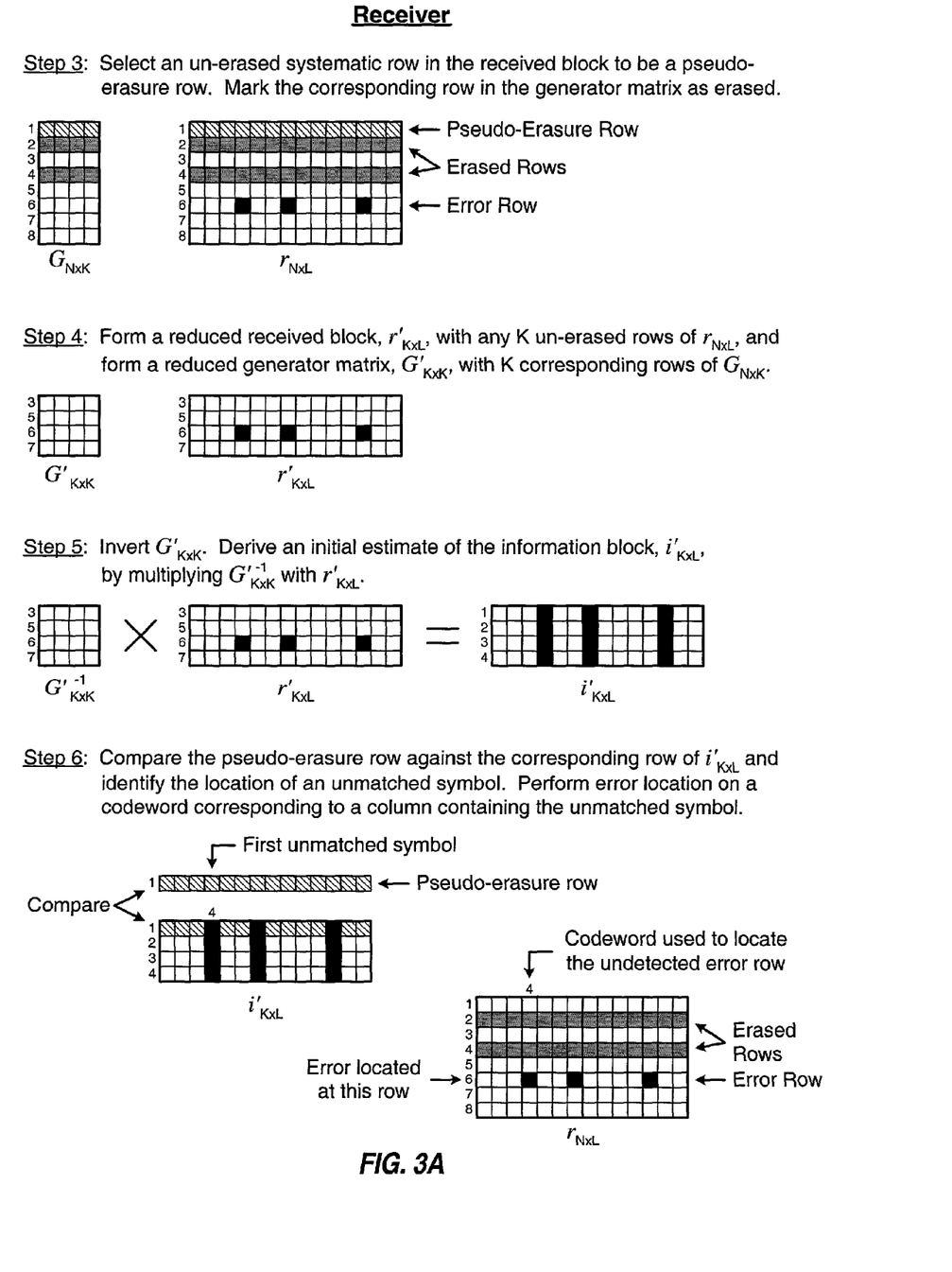
FIGS. 3A and B graphically illustrate the various steps for performing erasure-and-single-error correction block decoding for a linear block code.
Figure 3B:
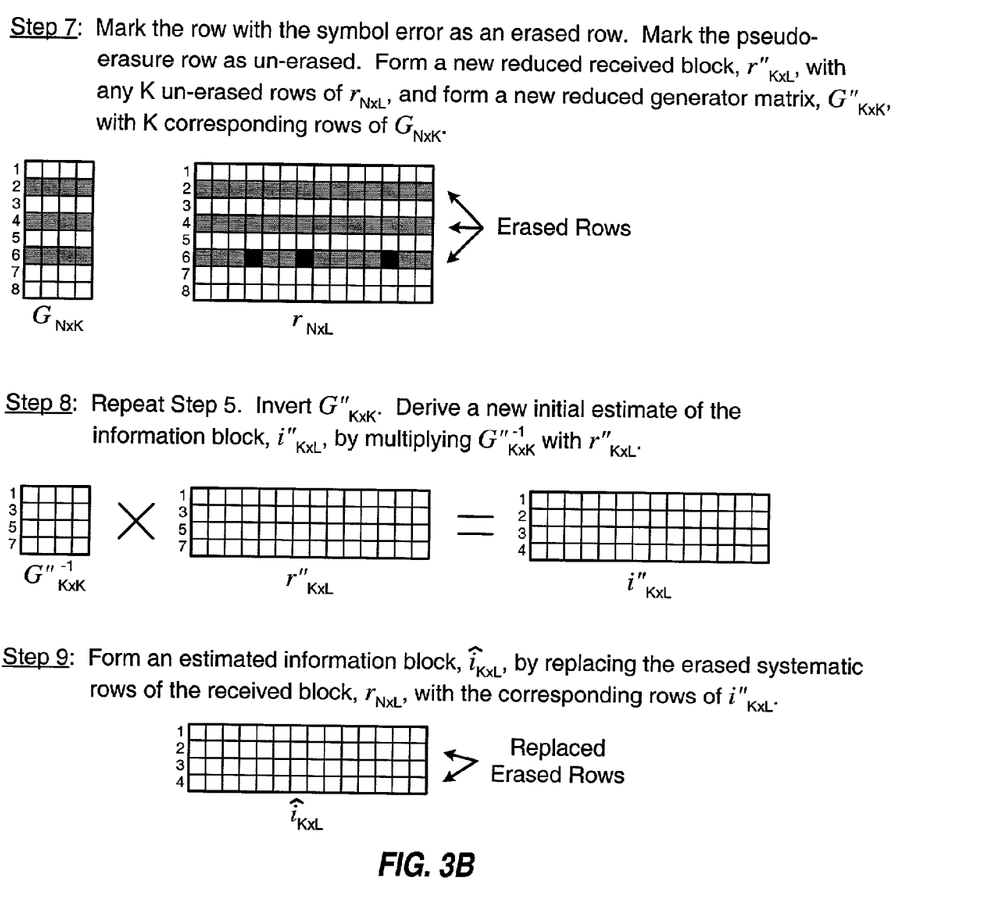

FIGS. 3A and B graphically illustrate the various steps for performing erasure-and-single-error correction block decoding for a linear block code. For simplicity, the embodiment of FIGS. 3A and B uses the same example used for FIG. 2, whereby the received block, $r_{N \times L}$, includes two erased rows 2 and 4, and one error row 6 (which contains multiple undetected symbol errors).

A block decoding technique that corrects for erasures and a single error may be performed as follows. Initially, each row of the received block, $r_{N \times L}$, may be checked by CRC checker 172 to determine whether the row has been received correctly or in error, and the row is marked as erased if the CRC does not check (step 2 in FIG. 2). An un-erased systematic row (e.g., the first such row) of the received block, $r_{N \times L}$, is then marked as a pseudo-erasure row (step 3 in FIG. 3A) and is treated like an erased row for some of the subsequent decoding steps (i.e., steps 4 and 5). Next, the rows of the generator matrix, $G_{N \times K}$, corresponding to the erased rows of the received block, $r_{N \times L}$, are also marked as erased (step 3). For the example shown in FIGS. 3A and 3B, rows 1, 2 and 4 of the generator matrix, $G_{N \times K}$, are marked as erased, as indicated by the shaded square boxes.

For the next step in the erasure-and-single-error correction block decoding, any K un-erased rows of the received block, $r_{N \times L}$, are selected to form the reduced received block, $r'_{K \times L}$, and the corresponding K rows of the generator matrix, $G_{N \times K}$, are also selected to form the reduced generator matrix, $G'_{K \times K}$ (step 4). For the exemplary embodiment shown in FIGS. 3A and 3B, the first four un-erased rows (i.e., rows 3, 5, 6, and 7) of the received block, $r_{N \times L}$, are selected to form the reduced received block, $r'_{K \times L}$, and the corresponding rows 3, 5, 6, and 7 of the generator matrix, $G_{N \times K}$, are selected to form the reduced generator matrix, $G'_{K \times K}$. Again for this example, one of the selected rows (i.e., row 6) happens to include undetected symbol errors.

The reduced generator matrix, $G'_{K \times K}$, is then inverted to derive an inverted generator matrix, $G'_{K \times K}{}^{-1}$ (step 5). Next, the inverted generator matrix, $G'_{K \times K}{}^{-1}$, is multiplied with the reduced received block, $r'_{K \times L}$, to derive the initial estimated information block, $i'_{K \times L}$ (step 5).

For the next step in the block decoding, the pseudo-erasure row (i.e., row 1) is compared against its corresponding row in the initial estimated information block, $i'_{K \times L}$ (step 6). Because of the matrix multiplication, any symbol error in the reduced received block, $r'_{K \times L}$, results in an entire column of symbol errors in the initial estimated information block, $i'_{K \times L}$. Thus, when the pseudo-erasure row is compared symbol-by-symbol against the corresponding row in the initial estimated information block, $i'_{K \times L}$, errors (i.e., unmatched symbols) are detected at columns 4, 7, and 12 since the symbols at these locations do not match.

A codeword corresponding to a column that contains an unmatched symbol is then selected (step 6). For the exemplary embodiment shown in FIGS. 3A and 3B, the codeword corresponding to the column containing the first unmatched symbol (i.e., column 4) is selected. Computation is then performed to locate the symbol error in the selected codeword. The error location may be determined based on various block decoding techniques known in the art. For example, for a Reed-Solomon code, syndromes are initially computed from the N symbols in the codeword, coefficients of an error location polynomial, $\sigma(x)$, are then calculated from the syndromes, and error locators may then be computed from these coefficients. For the exemplary embodiment shown in FIGS. 3A and 3B, the symbol error is located at the $6^{th}$ symbol position in the codeword.

In the next step, the entire row where the symbol error is located (i.e., row 6) is marked as an erased row, and the pseudo-erasure row (i.e., row 1) is marked as an un-erased row (step 7). The subsequent block decoding may then proceed as described above in FIG. 2. Specifically, any K un-erased rows of the received block, $r_{N \times L}$, (i.e., rows 1, 3, 5, and 7) may be selected to form a new reduced received block, $r''_{K \times L}$, and the corresponding K rows of the generator matrix, $G_{N \times K}$, are also selected to form a new reduced generator matrix, $G''_{K \times K}$. As shown in FIG. 3, the row with the (previously undetected) symbol errors (i.e., row 6) is marked as an erased row and is not selected for use.

The new reduced generator matrix, $G''_{K \times K}$, is then inverted to derive an inverted generator matrix, $G''_{K \times K}{}^{-1}$ (step 8). The inverted generator matrix, $G''_{K \times K}{}^{-1}$, is next multiplied with the reduced received block, $r''_{K \times L}$, to derive a new initial estimate of the information block, $i''_{K \times L}$. The estimate of the information block, $\hat{i}_{K \times L}$, may then be derived by replacing the erased systematic rows (i.e., rows 2 and 4) of the received block, $r_{N \times L}$, with the corresponding rows of the new initial estimated information block, $i''_{K \times L}$ (step 9).

Since the symbols in all of the rows of the new reduced received block, $r''_{K \times L}$, are correct values, the estimated information block, $\hat{i}_{K \times L}$, is equal to the transmitted information block, $i_{K \times L}$ (i.e., $\hat{i}_{K \times L} = i_{K \times L}$). In this example, the erasure-and-single-error correction block decoding is able to correct for two erased rows and a single error row in the received block, $r_{N \times L}$, by using the redundant parity rows (i.e., rows 5 and 7) to recover the erased systematic rows (i.e., rows 2 and 4).

In general, the erasure-and-single-error correction block decoding is achieved by (1) using the redundant parity rows to derive an estimate for an un-erased systematic row, (2) comparing the un-erased systematic row against its estimate to determine the location of any unmatched symbol (or error), (3) locating a symbol error in a codeword (or column) containing an unmatched symbol, (4) marking the entire row containing the symbol error as being erased, and (5) performing block decoding for the systematic rows based on the un-erased rows of the received block.

The erasure-and-single-error correction block decoding technique of the invention is less computationally intensive than conventional decoding techniques (partly because error location is performed for only one codeword if an undetected symbol error is subsequently detected with the pseudo-erasure row). The pseudo-erasure row may thus be used to pinpoint the exact codeword (or the exact column in a 2-dimensional block) where an undetected symbol error is located, and the exact location of the symbol error in the codeword (or the exact row of the 2-dimensional block) may be determined by performing block error location on the codeword. The row containing the (previously undetected) symbol error is then marked as erased and erasure-only correction block decoding may be performed on the received block.

Steps 3 through 6 in FIG. 3A effectively determine the particular column where an undetected symbol error may be found. Other schemes may also be used to determine the error column, and this is within the scope of the invention.

Moreover, in step 6, the pseudo-erasure does not need to be derived all at once (i.e., for the entire row). Instead, the pseudo-erasure may be derived one symbol at a time and compared to the corresponding symbol in the received pseudo-erasure row. That way, if an error is located in one of the first columns, the remaining pseudo-erasures in the row do not need to be derived.

The derivation of an initial estimate of the information block, $i'_{K \times L}$, and the formation of an estimated information block, $\hat{i}_{K \times L}$, are conceptual steps. These steps are shown for the example in FIGS. 3A and 3B to provide a better understanding of the block decoding technique. However, in practice, the only rows of $i'_{K \times L}$ that are derived are the ones that are erased in the original received block.

Because only (K+1) good rows (or CRC checked frames) in a received block are needed to perform erasure-and-single-error decoding, it is possible to turn off the front end of the receiver unit (e.g., receiver/demodulator 154, Viterbi decoder 162, deinterleaver 164, and CRC checker 172 in FIG. 1) as soon as (K+1) good rows have been received. This will save power in the receiver unit.

Figure 4:
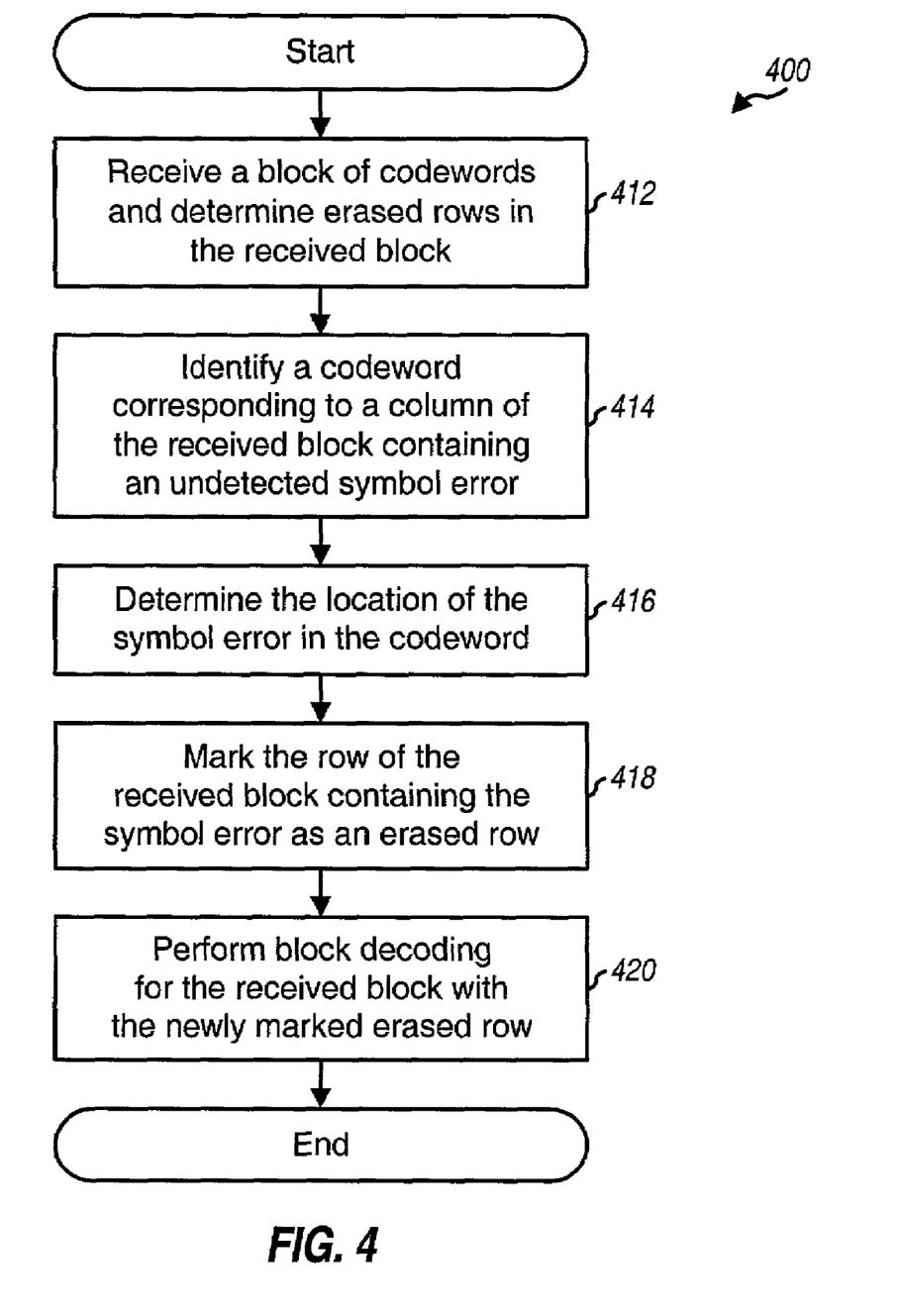
FIG. 4 is a simplified flow diagram of an embodiment of a process for performing erasure-and-single-error correction block decoding for a linear block code.

FIG. 4 is a simplified flow diagram of a process 400 for performing erasure-and-single-error correction block decoding for a linear block code, in accordance with an embodiment of the invention. Initially, a coded block comprised of a number of codewords is received, and erased rows in the received block are determined, at step 412. The erased rows may be determined by performing CRC check on each row of the received block, or by some other mechanisms.

A codeword corresponding to a column of the received block containing an undetected symbol error is then identified, at step 414. This undetected symbol error is one that is not included in an erased row of the received block. The column may be identified with the use of a pseudo-erasure row as described above or by some other means. The location of the symbol error in the codeword is then determined (e.g., using any technique known in the art), at step 416. The row of the received block containing the symbol error is then marked as an erased row, at step 418. Block decoding may then be performed for the received block with the newly marked erased row containing the symbol error, at step 420.

Figure 5A:
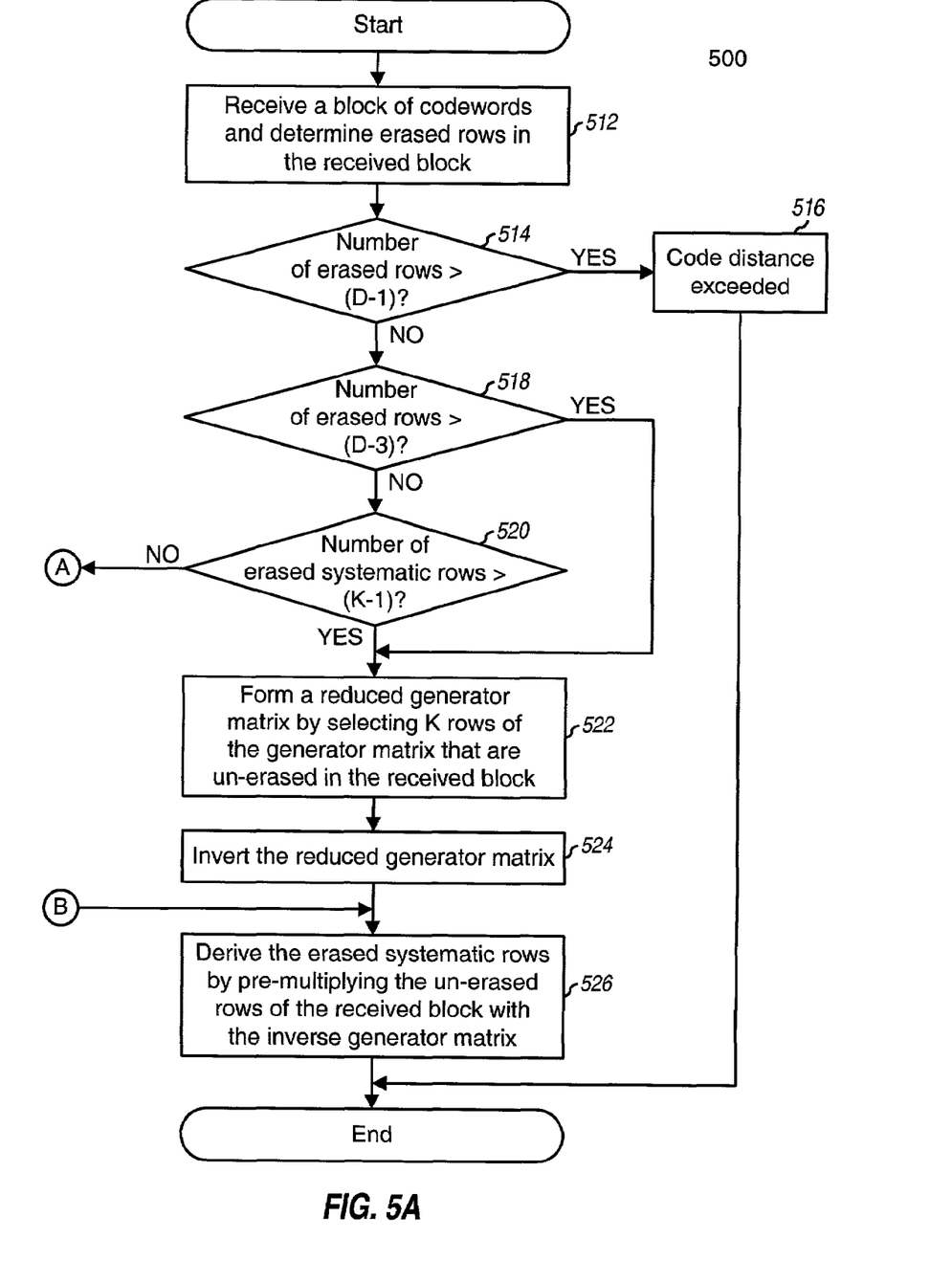
FIGS. 5A and B show a detailed flow diagram of an embodiment of a process for performing erasure-and-single-error correction block decoding for an (N, K) linear block code.
Figure 5B:
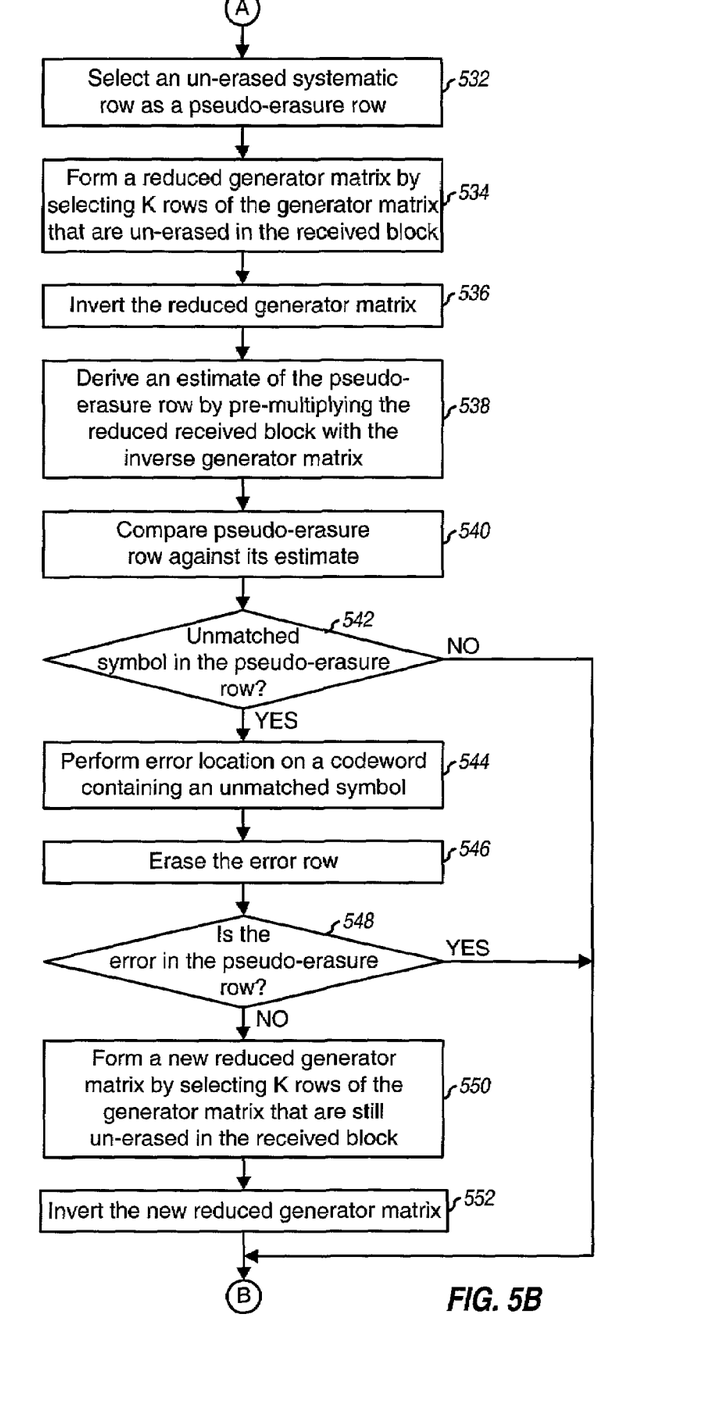

FIGS. 5A and 5B show a detailed flow diagram of a process 500 for performing erasure-and-single-error correction block decoding for an (N, K) linear block code, in accordance with an embodiment of the invention. Initially, a coded block comprised of a number of (L) codewords is received, and erased rows in the received block are determined, at step 512.

A determination is then made whether the number of erased rows in the received block is greater than (D−1), at step 514. As noted above in equation (1), a properly designed block code may be able to correct for up to (D−1) erased symbols in a codeword. Thus, if the number of erased rows exceeds (D−1), then correction for all the erased rows is not possible since the code distance is exceeded, as indicated at step 516. The process then terminates.

Otherwise, if the number of erased rows is equal to or less than (D−1), then a determination is made whether the number of erased rows in the received block is greater than (D−3), at step 518. As also noted above in equation (1), a properly designed block code may be able to correct for up to (D−3) erased symbols and one error symbol in a codeword. Thus, if the number of erased rows is equal to (D−2) or (D−1), then erasure-only correction for all the erased rows is possible and may be performed starting at step 522.

Otherwise, if the number of erased rows is equal to or less than (D−3), then a determination is made whether the number of erased systematic rows in the received block is greater than (K−1), at step 520. If one of the systematic rows is to be used as a pseudo-erasure row to locate the column of an undetected symbol error and if no un-erased systematic row is available for use as the pseudo-erasure row, then erasure-only correction for all the erased rows is still possible and may again be performed starting at step 522.

Otherwise, if the number of erased rows is equal to or less than (D−3) and at least one un-erased systematic row is available, then erasure-and-single-error correction block decoding may be performed on the received block, starting at step 532. In general, erasure-and-single-error correction block decoding may be performed whenever possible, and erasure-only correction block decoding may be performed if possible and if erasure-and-single-error correction block decoding cannot be performed.

To perform erasure-only correction block decoding, a reduced generator matrix, $G'_{K \times K}$, is initially formed by selecting K rows of the generator matrix, $G_{N \times K}$, corresponding to any K un-erased rows of the received block, $r_{N \times L}$, at step 522. The reduced generator matrix is then inverted, at step 524. The erased systematic rows of the received block are then derived from the corresponding rows of an initial estimate of the information block, $i'_{K \times L}$, which is derived by multiplying the inverse generator matrix, $G'_{K \times K}{}^{-1}$, with a reduced received block, $r'_{K \times L}$, formed by K corresponding un-erased rows of the received block, $r_{N \times L}$, at step 526. If there are no undetected symbol errors in the rows in the reduced received block, $r'_{K \times L}$, then the initial estimated information block, $i'_{K \times L}$, would include corrections for all the erased systematic rows in the received block. The erasure-only correction block decoding then terminates.

To perform erasure-and-single-error correction block decoding, the row location of an undetected symbol error in the received block is initially determined. This may be achieved as follows. First, an un-erased systematic row (e.g., the first such row in the received block) is selected as a pseudo-erasure row, at step 532. This row is treated as an erased row in the following steps to determine the undetected symbol error location. A reduced generator matrix, $G'_{K \times K}$, is then formed by selecting K rows of the generator matrix, $G_{N \times K}$, corresponding to any K un-erased rows of the received block, $r_{N \times L}$, at step 534. The reduced generator matrix is then inverted, at step 536. An estimate of the pseudo-erasure row is then derived by multiplying the inverse generator matrix, $G'_{K \times K}{}^{-1}$, with a reduced received block, $r'_{K \times L}$, formed by K corresponding un-erased rows of the received block, $r_{N \times L}$, at step 538. Since only the estimate of the pseudo-erasure row is needed, the matrix multiplication of $G'_{K \times K}{}^{-1}$ with $r'_{K \times L}$ may be performed for only one row of $G'_{K \times K}{}^{-1}$ (and not the entire matrix) against all columns of $r'_{K \times L}$.

The pseudo-erasure row is then compared against its estimate, at step 540. The comparison may be performed symbol-by-symbol until a first unmatched symbol is detected. A determination is then made whether or not there are any unmatched symbols in the pseudo-erasure row, at step 542. If there are no unmatched symbols, then there are no undetected symbol errors in the received block (or there is more than one symbol error in a single column), and the process proceeds to step 526 to derive the erased systematic rows.

Otherwise, if there is at least one unmatched symbol in the pseudo-erasure row, as determined in step 542, then there are undetected symbol errors present in the received block and the row location of these errors is next determined, at step 544. This may be achieved by identifying the location of an unmatched symbol (e.g., the first unmatched symbol) in the pseudo-erasure row, retrieving the codeword (or column of the received block) containing this unmatched symbol, and performing error location on this codeword based on any technique known in the art. The symbol error in the codeword is thus located, and the entire row of the received block containing this symbol error is marked as an erased row, at step 546.

A determination is then made whether or not the pseudo-erasure row is the one with the symbol error, at step 548. If the answer is yes, the error row was already excluded as the pseudo-erasure when the reduced received block and reduced generator matrix were formed. Therefore $G'_{K \times K}{}^{-1}$ is correct and $r'_{K \times L}$ does not contain any undetected errors. The process then proceeds to step 526 where the erased systematic rows are derived. Otherwise, a new reduced generator matrix, $G''_{K \times K}$, is then formed by selecting K rows of the generator matrix, $G_{N \times K}$, corresponding to any K rows of the received block, $r_{N \times L}$, that are still un-erased, at step 550. The new reduced generator matrix is then inverted, at step 552.

The process then proceeds to step 526 where the erased systematic rows of the received block are derived from the corresponding rows of the new initial estimate of the information block, $i''_{K \times L}$, which is derived by multiplying the new inverse generator matrix, $G''_{K \times K}{}^{-1}$, with a new reduced received block, $r''_{K \times L}$, formed by K corresponding un-erased rows of the received block, $r_{N \times L}$.

Various modifications to the process shown in FIG. 5 may be made. For example, it may be possible to iterate steps 532 through 546 multiple times to detect for multiple error rows.

The block decoding techniques of the invention may be advantageously used for a concatenated code comprised of an error detection code and a block code. The error detection coding may be performed in one (e.g., horizontal) dimension of an information block and the block coding may be performed in the other (e.g., vertical) dimension of the information block. The inventive block decoding techniques may be used to identify and locate errors that the error detection decoding fails to catch, and to remove these symbol errors from the block decoding process. Thus, the inventive block decoding techniques can ameliorate problems caused by failure to detect errors, which cannot be handled by conventional block decoding techniques that can only correct for erasures but not errors.

The inventive block decoding described herein is computationally efficient and may be well suited for a software-based implementation executed on a microprocessor. To quantify the computational efficiency, the number of multiply-accumulate operations performed by some of the steps in the flow diagram in FIGS. 5A and 5B is provided below:

| Steps | Number of Multiply-Accumulate Operations |
|---|---|
| 524, 536, 552 | $KP_{sys}^2$ (for each step) |
| 538 | KL |
| 544 | $(P + 2)(N - 1) + P(P + 1) + 1$ (for a Reed-Solomon code) |
| 526 | $KLP_{sys}$ | where

N is the codeword length;

K is the number of information symbols in a codeword;

R is the number of parity symbols (i.e., R=N−K);

L is the number of codewords per coded block;

P is the number of erased rows in the received block; and $P_{sys}$ is the number of erased systematic rows in the received block.

The inventive block decoding techniques described herein may be used for various communication and data transmission systems. For example, these techniques may be advantageously used for wireless communication systems such as CDMA, FDMA, and TDMA systems. Moreover, the decoding techniques described herein may be implemented in a terminal (e.g., a wireless device such as a cellular telephone) for the downlink (i.e., the forward link) or at a base station or access point for the uplink (i.e., the reverse link) in a wireless communication system.

As noted above, the inventive block decoding techniques described herein may be implemented by various means. For example, these techniques may be implemented in hardware, software, or a combination thereof. For a hardware implementation, the elements used to implement some or all of the block decoding may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. The hardware (e.g., an ASIC or DSP) may include one or more functional units that collectively perform the processing described above to implement the inventive block decoding. For example, one unit may be provided to perform the row-wise error detection (e.g., CRC checker 172), another unit may be provided to perform the column-wise block decoding (e.g., block decoder 174), and so on.

For a software implementation, the inventive block decoding techniques may be implemented with modules (e.g., procedures, functions, and so on) that perform the functions described herein. The software codes may be stored in a memory unit (e.g., memory 182 in FIG. 1) and executed by a processor (e.g., controller 180). The memory unit may be implemented within the processor or external to the processor, in which case it can be communicatively coupled to the processor via various means as is known in the art.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of performing erasure-and-error correction block decoding on a received block of symbols using erasure-only correction block decoding, comprising:

obtaining the received block of symbols previously coded column-wise with an (N, K) linear block code and row-wise with an error detection code;

identifying a codeword with an undetected symbol error and corresponding to a column of the received block where the undetected symbol error is located;

determining the location of the undetected symbol error in the codeword;

marking a row of the received block containing the undetected symbol error as an erased row; and performing erasure-only correction block decoding on the received block with the marked erased row.

2. The method of claim 1, further comprising:

deriving an estimate of an un-erased systematic row of the received block;

comparing the un-erased systematic row against its estimate; and identifying the location of an unmatched symbol between the un-erased systematic row and its estimate, and wherein the codeword with the undetected symbol error is identified as corresponding to the column containing die unmatched symbol.

3. The method of claim 2, wherein the estimate of the un-erased systematic row is derived by marking the un-erased systematic row as an erased row;

forming a reduced received block comprised of K un-erased rows of the received block and multiplying an inverse generator matrix for the K un-erased rows with the reduced received block.

4. The method of claim 1, wherein the location of the undetected symbol error in the codeword is determined by performing error location on the codeword based on a particular block decoding scheme.

5. The method of claim 1, wherein the performing erasure-only correction block decoding includes forming a reduced received block comprised of K un-erased rows of the received block and omitting the marked erased row;

forming a reduced generator matrix comprised of K lows of a generator matrix corresponding to the K un-erased rows;

inverting the reduced generator matrix; and multiplying the inverted generator matrix with the reduced received block.

6. The meted of claim 1, further comprising:
marking each row of to received block as either an erased row or an un-erased row until at least (K+1) un-erased rows are found or all rows of the received block are marked.

7. The method of claim 6, wherein each row is marked as an erased row or an un-erased row based on a result of a cyclic redundancy check (CRC) test.

8. The method of claim 1, further comprising:
determining the number of erased rows in the received block.

9. The method of claim 8, further comprising:
performing erasure-only correction block decoding if the number of erased rows is equal to (D−2) or (D−1), where D is a minimum distance of the (N, K) linear block code.

10. The method of claim 8, further comprising:
performing erasure-and-error correction block decoding if the number of erased rows is less than or equal to (D−3) where D is a minimum distance of the (N, K) linear block code.

11. The method of claim 8, further comprising:
determining the number of erased systematic rows in the received block; and
performing erasure-and-error correction black decoding if the number of erased rows is less than or equal to (D−3) and the number of erased systematic rows is less than or equal to (K−1), where D is a minimum distance of the (N, K) linear block code.

12. A method of perforating block decoding comprising:
obtaining a received block of symbols previously coded column-wise with an (N, K) linear block code and row-wise with an error detection code;
marking each row of the received block as either an erased row or an un-erased row;
determining the number of erased rows in the received block;
performing erasure-only correction block decoding if the number of erased rows is equal to (D−2) or (D−1), where D is a minimum distance of the (N, K) linear block code;
determining the number of erased systematic rows in the received block;
performing erasure-and-error correction block decoding using erasure-only correction block decoding if the number of erased rows is less than or equal to (D−3) and the number of erased systematic rows is less than or equal to (K−1); and
declaring a block error if the number of erased rows exceeds (D−1).

13. The method of claim 1, wherein the (N, K) linear block code is a Reed-Solomon code.

14. A method of performing erasure-and-error correction block decoding on a received block of symbols using erasure-only correction block decoding, comprising:
obtaining the received block of symbols previously coded column-wise with an (N, K) linear block code and row-wise with an error detection code;
marking each row of the received block as either an erased or an un-erased row until at least (K+1) un-erased rows are found or all rows of the received block are marked;
deriving an estimate of an un-erased systematic row of the received block;
comparing the un-erased systematic row against its estimate;
identifying an unmatched symbol between the un-erased systematic row and its estimate;
identifying a codeword with a symbol error and corresponding to a column of the received block containing the unmatched symbol;
determining the location of the symbol error in the codeword based on a particular block decoding scheme;
marking a row of the received block containing the symbol error as an erased row, and
performing erasure-only correction block decoding on the received block with the marked erased row.

15. A computer program product for performing erasure-and-error correction block decoding on a received block of symbols using erasure-only correction block decoding comprising:
code for obtaining the received block of symbols previously coded column-wise with an (N, K) linear block code and row-wise with an error detection code;
code for identifying a codeword with an undetected symbol error and corresponding to a column of the received block where the undetected symbol error is located;
code for determining the location of the undetected symbol error in the codeword;
code for marking a row of the received block containing the undetected symbol error as an erased row;
code for performing erasure-only correction block decoding on the received block with the marked erased row; and
a computer-usable medium for storing the codes.

16. The computer program product of claim 15, further comprising:
code for deriving an estimate of an un-erased systematic row of the received block;
code for comparing the un-erased systematic row against its estimate; and
code for identifying the location of an unmatched symbol between the un-erased systematic row and its estimate, and wherein the codeword with the undetected symbol error is identified as corresponding to the column containing the unmatched symbol.

17. The computer program product of claim 16, wherein the code for deriving the estimate of the un-erased systematic row includes:
code for marking the tm-erased systematic row as an erased row;
code for forming a reduced received block comprised of K un-erased rows of the received block; and
code for multiplying an inverse generator matrix for the K un-erased rows with the reduced received block.

18. The computer program product of claim 15, wherein the code for performing block decoding includes:
code for forming a reduced received block comprised of K un-erased rows of the received block and omitting the marked erased row;
code for forming a reduced generator matrix comprised of K rows of a generator matrix corresponding to the K un-erased rows;
code for inverting the reduced generator matrix; and
code for multiplying the inverted generator matrix with the reduced received block.

19. A memory communicatively coupled to a digital signal processing device (DSPD) capable of interpreting digital information to:

obtain a received block of symbols previously coded column-wise with an (N, K) linear block code and row-wise with an error detection code;

identify a codeword with an undetected symbol error and corresponding to a column of the received block where the undetected symbol error is located;

determine the location of the undetected symbol error in the codeword;

mark a row of the received block containing the undetected symbol error as an erased row; and perform erasure-only correction block decoding on the received block with the marked erased row.

20. A digital signal processor comprising:

a first unit operative to receive a block of symbols previously coded column-wise with an (N, K) linear block code and row-wise with an error detection code and to mark each row of the received block as either an erased row or an un-erased row until at least (K+1) un-erased rows are found or all rows of the received block are marked; and a second unit operative to identify a codeword with an undetected symbol error and corresponding to a column of the received block where the undetected symbol error is located, determine the location of the undetected symbol error in the codeword, mark a row of the received block containing the undetected symbol error as an erased row, and perform erasure-only correction block decoding on the received block with the marked erased row.

21. The digital signal processor of claim 20, wherein the second unit is further operative to derive an estimate of an un-erased systematic row of the received block, compare the un-erased systematic row against its estimate, identify the location of an unmatched symbol between the un-erased systematic row and its estimate, and identify codeword with the undetected symbol error as corresponding to the column containing the unmatched symbol.

22. The digital signal processor of claim 20, wherein the second unit is further operative to mark the un-erased systematic row as an erased row, form a reduced received block comprised of K un-erased rows of the received block, and multiply an inverse generator matrix for the K un-erased rows with the reduced received block.

23. The digital signal processor of claim 20, wherein the second unit is further operative to form a reduced received block comprised of K un-erased rows of the received block and omitting the marked erased row, form a reduced generator matrix comprised of K rows of a generator matrix corresponding to the K un-erased rows, invert the reduced generator matrix, and multiply the inverted generator matrix wit the reduced received block.

24. A decoder comprising:

a first decoder operative to receive a block of symbols previously coded column-wise with an (N, K) linear block code and row-wise with an error detection code and to mark each row of the received block as either an erased row or an un-erased row until at least (K+1) un-erased rows are found or all rows of the received block are market; and a second decoder operative to identify a codeword with an undetected symbol error and corresponding to a column of the received block where the undetected symbol error is located, determine the location of the undetected symbol error in the codeword, mark a row of the received block containing the undetected symbol error as an erased row, and perform erasure-only correction block decoding on the received block with the marked erased row.

25. The decoder of claim 24, wherein the first decoder is operative to mark each row as an erased row or an un-erased row based on a result of a cyclic redundancy check (CRC) test.

26. The decoder of claim 24, wherein the (N, K) linear block code is a Reed-Solomon code.

27. A decoding apparatus comprising:

means for marking each row of a received block, previously coded column-wise with an (N, K) linear block code and row-wise with an error detection code, as either an erased row or an un-erased row until at least (K+1) un-erased rows are found or all rows of the received block are marked;

means for identifying a codeword with an undetected symbol error and corresponding to a column of the received block where the undetected symbol error is located;

means for determining the location of the undetected symbol error in the codeword;

means for marking a row of the received block containing the undetected symbol error as an erased row; and means for performing erasure-only correction block decoding on the received block with the marked erased row.

28. The decoding apparatus of claim 27, further comprising:

means for deriving an estimate of an un-erased systematic row of the received block;

means for comparing the un-erased systematic row against its estimate; and means for identifying the location of an unmatched symbol between the un-erased systematic row and its estimate, and wherein the codeword with the undetected symbol error is identified as corresponding to the column containing the unmatched symbol.

29. The decoding apparatus of claim 28, wherein the means for performing block decoding includes:

means for marking the un-erased systematic row as an erased row;

means for forming a reduced received block comprised of K un-erased rows of the received block; and means for multiplying an inverse generator matrix for the K un-erased rows with the reduced received block.

30. The decoding apparatus of claim 27, wherein the means for performing block decoding includes:

means for forming a reduced received block comprised of K un-erased rows of the received block and omitting the marked erased row;

means for forming a reduced generator matrix comprised of K rows of a generator matrix corresponding to the K un-erased rows;

means for inverting the reduced generator matrix; and means for multiplying the inverted generator matrix with the reduced received block.

31. A receiver unit in a wireless communication system, comprising:

a receiver operative to process a received signal to provide data samples;

a demodulator operative to process the data samples to provide a received block of symbols;

a first decoder operative to mark each row of the received block as either an erased row or an un-erased row; and a second decoder operative to identify a codeword with an undetected symbol error and corresponding to a column of the received block where the undetected symbol error is located, determine the location of the undetected symbol error in the codeword, mark a row of the received block containing the undetected symbol error as an erased row, and perform erasure-only correction block decoding on the received block with the marked erased row.

32. The receiver unit of claim 31, further comprising:
a third decoder operative to receive and decode demodulated data from the demodulator in accordance with a particular convolutional decoding scheme to provide the received block of symbols.

* * * * *